United States Patent
Wurm et al.

(10) Patent No.: US 7,626,682 B2
(45) Date of Patent: Dec. 1, 2009

(54) RETICLE STAGES FOR LITHOGRAPHY SYSTEMS AND LITHOGRAPHY METHODS

(75) Inventors: Stefan Wurm, Austin, TX (US); Siegfried Schwarzl, Bavaria (DE)

(73) Assignee: Infineon Technologies AG, Munich (DE)

(*) Notice: Subject to any disclaimer, the term of this patent is extended or adjusted under 35 U.S.C. 154(b) by 560 days.

(21) Appl. No.: 11/403,483

(22) Filed: Apr. 13, 2006

(65) Prior Publication Data
US 2007/0242257 A1    Oct. 18, 2007

(51) Int. Cl.
G03B 27/62    (2006.01)
G03B 27/42    (2006.01)
(52) U.S. Cl. .......................... 355/75; 355/53
(58) Field of Classification Search ................ 355/75, 355/53, 77, 30; 250/492.1; 347/239; 356/399, 356/400, 401
See application file for complete search history.

(56) References Cited

U.S. PATENT DOCUMENTS

| 5,877,843 | A* | 3/1999 | Takagi et al. ................ 355/30 |
| 6,429,440 | B1* | 8/2002 | Bleeker ................... 250/492.1 |
| 6,934,006 | B2* | 8/2005 | Park et al. ................... 355/53 |
| 2002/0036762 | A1* | 3/2002 | Nishi ......................... 355/53 |
| 2003/0142284 | A1* | 7/2003 | Lin ............................. 355/77 |
| 2005/0174424 | A1* | 8/2005 | Kishima ................... 347/239 |

OTHER PUBLICATIONS

"193nm Immersion Lithography: Immersion—Taking the Plunge," International Sematech Litho Forum, http://www.sematech.org/resources/litho/meetings/forum/20040128/index.htm, Jan. 28, 2004, 22 pp., Sematech, Inc., Los Angeles, CA.
"ASML: 193nm Immersion Lithography," International Sematech Litho Forum, http://www.sematech.org/resources/litho/meetings/forum/20040128/index.htm, Jan. 28, 2004, 22 pp., Sematech, Inc., Los Angeles, CA.
Hata, H., "The Development of Immersion Exposure Tools," International Sematech Litho Forum, http://www.sematech.org/resources/litho/meetings/forum/20040128/index.htm, Jan. 28, 2004, 25 pp., Sematech, Inc., Los Angeles, CA.
Lin, B.J., "TSMC Plan with Immersion Lithography," International Sematech Litho Forum, http://www.sematech.org/resources/litho/meetings/forum/20040128/index.htm, Jan. 28, 2004, 18 pp., Sematech, Inc., Los Angeles, CA.
Owa, S., et al., "Update on 193nm Immersion Exposure Tool," International Sematech Litho Forum, http://www.sematech.org/resources/litho/meetings/forum/20040128/index.htm, Jan. 28, 2004, 51 pp., Sematech, Inc., Los Angeles, CA.
Sato, M., et al., "TOK Resist & Material Development Status for Immersion Lithography," International Sematech Litho Forum, http://www.sematech.org/resources/litho/meetings/forum/20040128/index.htm, Jan. 28, 2004, 20 pp., Sematech, Inc., Los Angeles, CA.

* cited by examiner

*Primary Examiner*—Peter B Kim
(74) *Attorney, Agent, or Firm*—Slater & Matsil, L.L.P.

(57) ABSTRACT

Reticle stages for lithography systems and lithography methods are disclosed. In a preferred embodiment, a lithography reticle stage includes a first region adapted to support a first reticle, and at least one second region adapted to support a second reticle.

12 Claims, 7 Drawing Sheets

US 7,626,682 B2

RETICLE STAGES FOR LITHOGRAPHY SYSTEMS AND LITHOGRAPHY METHODS

TECHNICAL FIELD

The present invention relates generally to the fabrication of semiconductor devices, and more particularly to stages for supporting lithography reticles during the patterning of material layers of semiconductor devices.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (ICs). There may be a plurality of transistors, memory devices, switches, conductive lines, diodes, capacitors, logic circuits, and other electronic components formed on a single die or chip, for example.

Optical photolithography involves projecting or transmitting light through a pattern comprised of optically opaque or translucent areas and optically clear or transparent areas on a mask or reticle. For many years in the semiconductor industry, optical lithography techniques such as contact printing, proximity printing, and projection printing have been used to pattern material layers of integrated circuits. Lens projection systems and transmission lithography masks are used for patterning, wherein light is passed through the lithography mask to impinge upon a photosensitive material layer disposed on semiconductor wafer or workpiece. After development, the photosensitive material layer is then used as a mask to pattern an underlying material layer.

There is a trend in the semiconductor industry towards scaling down the size of integrated circuits, to meet the demands of increased performance and smaller device size. As features of semiconductor devices become smaller, it becomes more difficult to pattern the various material layers because of diffraction and other effects that occur during the lithography process. In particular, lithography techniques used to pattern the various material layers become challenging as device features shrink.

Thus, what are needed in the art are improved methods, systems, and devices for patterning material layers of semiconductor devices.

SUMMARY OF THE INVENTION

These and other problems are generally solved or circumvented, and technical advantages are generally achieved, by preferred embodiments of the present invention, which provide novel reticle stage design concepts that enable high throughput double exposure lithography techniques.

In accordance with a preferred embodiment of the present invention, a lithography reticle stage includes a first region adapted to support a first reticle, and at least one second region adapted to support a second reticle.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
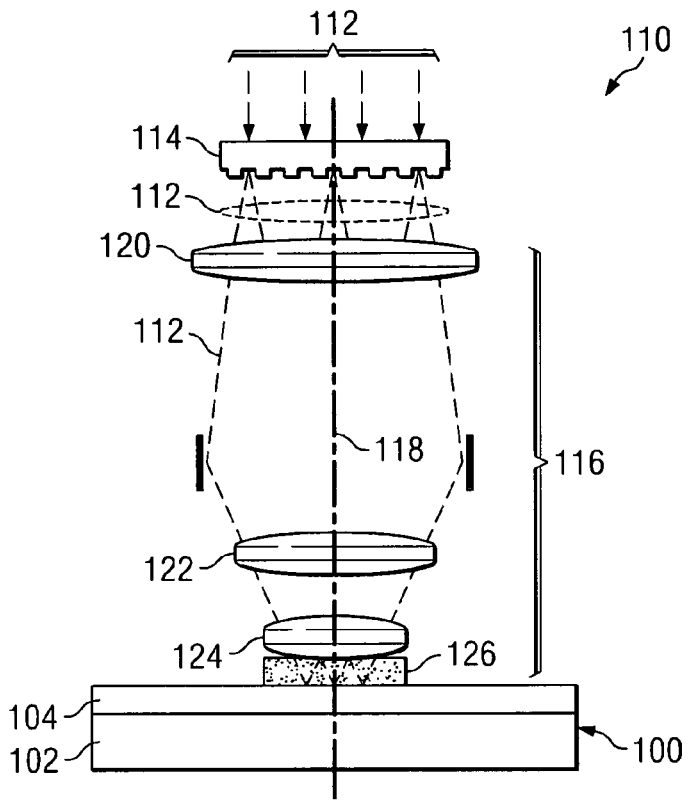
FIG. 1 illustrates a prior art immersion lithography system.

The making and using of the presently preferred embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely implemented in a lithography system used to pattern material layers of semiconductor devices. Embodiments of the invention may also be applied, however, to other applications where material layers are patterned using lithography, for example.

Immersion lithography at a wavelength of 193 nm is a technology that is being considered for printing very small electronic circuit features on silicon wafers in the future. Except for the immersion liquid and the last lens element of the objective lens, which are new to lithography, immersion lithography is expected to build on the current 193 nm dry lithography infrastructure in an evolutionary way, specifically with respect to the current lithography mask infrastructure. The terms "mask" and "reticle" are both used herein to refer to a plate having a pattern disposed thereon that is to be transferred to a material layer of a semiconductor device.

As feature sizes continue to shrink below 45 nm, it becomes exceedingly difficult to use a single lithography mask for imaging a set of different features and feature sizes on a material layer. For example, if only one lithography mask is used, the common process window may be too small to image both vertical and horizontal lines, or lines of different critical dimensions, on the same lithography mask with large enough process windows for both the vertical and horizontal lines. The terms "horizontal" and "vertical" are referred to herein with respect to the scanning direction of the mask and wafer stages, e.g., wherein the term "horizontal" refers to the direction of the scanning and the term vertical refers to a direction substantially perpendicular to the scanning direction. The common process window defines the depth of focus (DOF) and exposure latitude (EL) range within which different features can be imaged so that the critical dimensions (CD) for all the features on a wafer are within a specification for the device to be manufactured, for example.

Currently, in some advanced lithography applications in the semiconductor industry, contact holes (e.g., comprising substantially round features) and lines and spaces (e.g., comprising substantially rectangular features) need to be imaged using different lithography masks so that the illumination parameters can be optimized separately for the contacts and the lines to meet CD requirements for both feature types. Therefore, the extension of 193 nm immersion lithography to feature sizes smaller than about 45 nm is expected to require the use of two separate masks where currently a single mask can be used. For example, one mask may be required to pattern horizontal lines and another mask may be required to pattern vertical features. More generally, one mask may be required to pattern features in a first direction, and an additional mask may be required to pattern features in a second direction, wherein the second direction is substantially orthogonal to the first direction in a plane coincident with a semiconductor wafer surface, for example.

In addition, to increase the resolution for 193 nm immersion lithography down to about 45 nm or less feature sizes, double exposure techniques have been proposed, which also will double the number of lithography masks that need to be used to print a given feature at such a high resolution. Again, in order to print lines and spaces in a given direction at the desired resolution, the use of two lithography masks would be required. For example, to print a grid of vertical lines at 22 nm would require the use of two lithography masks that are used in succession to expose a semiconductor wafer, where only one lithography mask can be used to print such a grid with a larger size, such as a 65 nm feature size. Lithography techniques that require the use of two lithography masks to image a set of features will be referred to as double exposure techniques in the discussion herein.

There are other applications where a double exposure, using two masks, would be beneficial. Polarization of light during the lithography process can cause features to align differently in a vertical direction and a horizontal direction due to light polarization, for example. Using two masks in such a case would be beneficial, for example.

Prior art lithography tools and systems are adapted to support only one lithography mask. Therefore, a double exposure technique would require loading a first lithography mask into the tool, aligning the first mask, and printing the mask on all fields on the semiconductor wafer. Then the first mask would be unloaded from the tool, and a second lithography mask would be loaded into the tool. The second mask would then be aligned and printed onto all fields of the semiconductor wafer.

Although it would be possible to expose all wafers in a particular typical batch or lot, which typically comprises about 20 to 25 wafers, first with one mask and then with a second mask, this would involve realigning the wafers two times while still requiring the alignment of the two masks for each wafer, which is time-consuming. However, it is desirable to image the two masks into the layer of photoresist on the wafers with very little time delay. Utilizing a double exposure process using prior art lithography tool technology would result in a significantly lower wafer throughput of a lithography tool. A limiting factor for tool throughput is the time required to load and align the wafers and masks, rather than the actual exposure time, for example. Having to load two masks in two separate steps for each wafer results in a reduction in wafer throughput by a factor of about two, for example. This leads to an increased cost of ownership of lithography tools for the industry and reduced tool productivity.

Embodiments of the present invention achieve technical advantages by providing novel supports or stages for lithography masks or reticles that are adapted to support two or more lithography masks, to be described further herein.

First, a schematic of a prior art optical immersion lithography system 110 is shown in FIG. 1. The lithography system 110 shown in FIG. 1 is also referred to in the art as a scanner, stepper, or exposure tool, as examples. A semiconductor device 100, also referred to herein as a wafer 100, to be patterned includes a workpiece 102 and a layer of photosensitive material 104 disposed over the workpiece 102. The workpiece 102 includes a material layer to be patterned using the layer of photosensitive material 104, not shown. The semiconductor device 100 is placed on a wafer support or stage (not shown) proximate an optics column 116. The optics column 116 is also referred to herein as a lens system 116.

A lithography mask 114 is disposed between the optics column 116 and an illuminator (not shown) or light source. Light, energy, or radiation 112 from the illuminator is passed through the lithography mask 114 and the optics column 116 to impinge upon the layer of photosensitive material 104 on the semiconductor device 100, patterning the layer of photosensitive material 104 with the pattern of the lithography mask 114. After exposure, the pattern in the layer of photosensitive material comprises a latent pattern, which is then developed to form a pattern in the layer of photosensitive material. The optics column 116 may include an optical axis 118, an objective lens 120, a last lens 124, and a plurality of other lenses 122, although only one lens 122 is shown in FIG. 1. In an immersion lithography system 110, for example, an immersion fluid 126 is disposed between the last lens 124 and the semiconductor device 100, as shown.

The lithography system 110 shown in FIG. 1 is often referred to in the art as step and scan lithography system or tool, for example. The lithography system may comprise a 193 nm immersion lithography system wherein the light 112 used to expose the wafer 100 comprises a wavelength of about 193 nm, for example. When an image from the mask 114 area is imaged onto a wafer 100, only a small portion of the mask 114 is illuminated as the mask 114 is scanned in the object plane of the system through the illuminated area, while the wafer 100 is synchronously scanned at 1/M of the mask 114 scan speed, with M being the demagnification of the system. After the mask 114 image has been transferred onto one wafer 100 field, the wafer 100 is stepped to the next field position, the mask 114 is moved back into the start position, and the next field scan begins.

Figure 2:
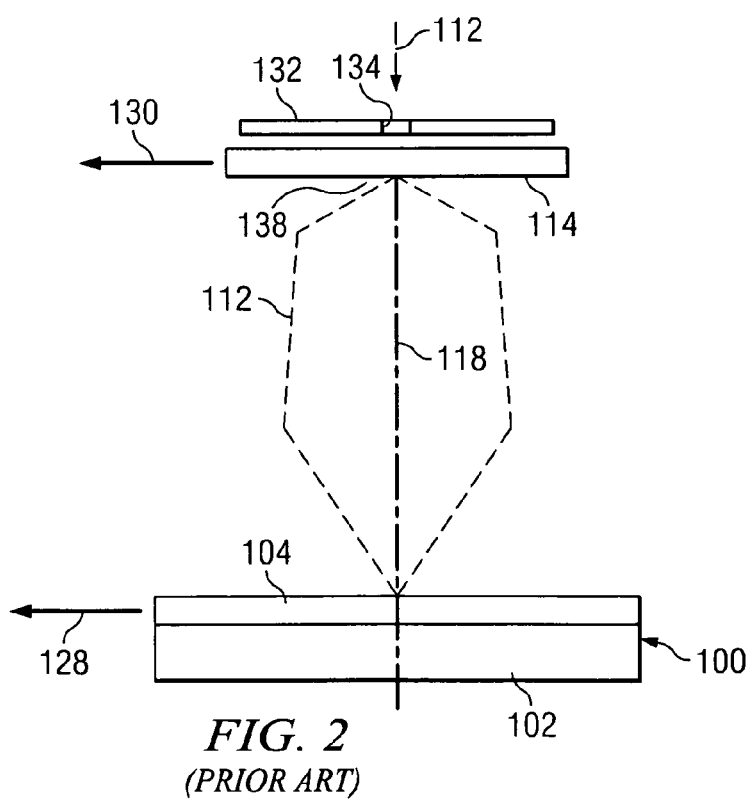
FIG. 2 shows a prior art lithography system, wherein a lithography mask and a semiconductor wafer are moved during a scanning process to pattern a layer of photosensitive material on the semiconductor wafer.

FIG. 2 shows a more detailed schematic of an exposure process in a prior art lithography system. As the light or radiation 112 is directed towards a semiconductor device or wafer 100, the semiconductor device 100 is scanned or moved in a first direction 128, and the lithography mask 114 is moved in a second direction 130. The first direction 128 and the second direction 130 may comprise the same direction, for example, as shown, or may comprise opposite directions in some systems. The mask 114 is disposed before the projection optics (e.g., the optics column 116 shown in FIG. 1) and the wafer or semiconductor device 100 is disposed behind the projection optics 116, as shown. The mask 114 and the wafer 100 are both scanned through the static illumination area of the tool, e.g., through a slit 134 in a plate 132. The illuminated mask area proximate the slit 134 is shown at 138.

Figure 3:
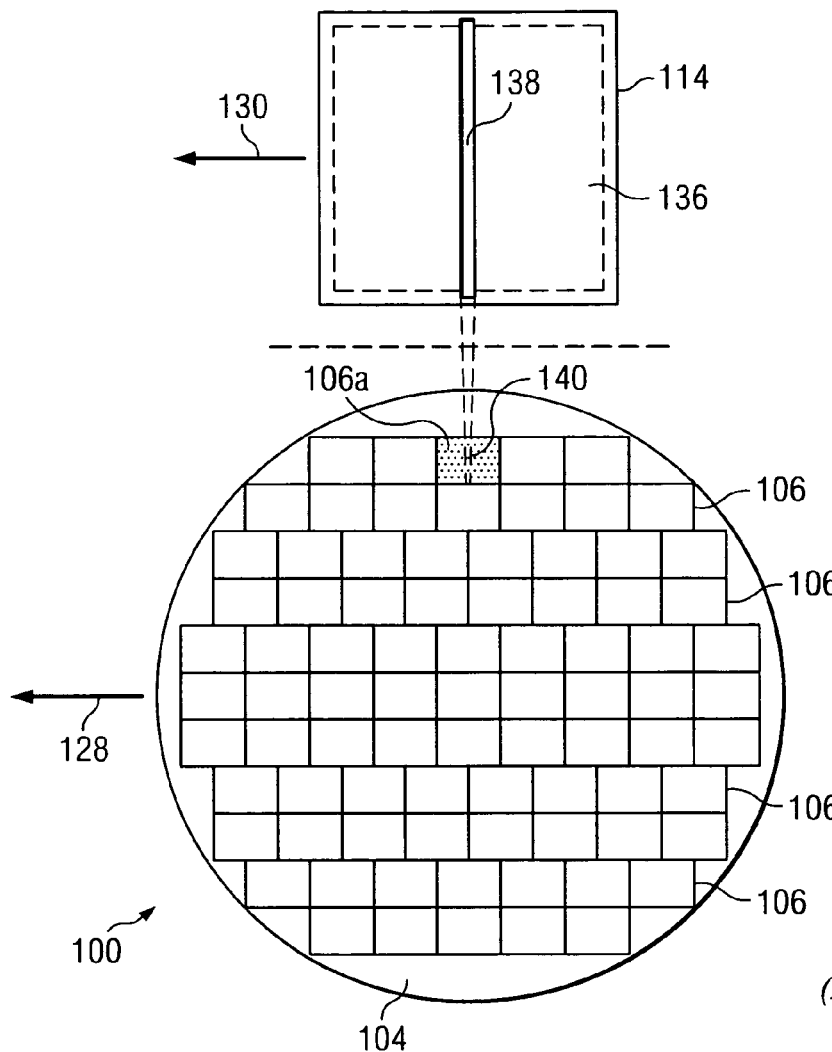
FIG. 3 illustrates a prior art exposure process wherein portions of a wafer are patterned by scanning a lithography mask through an exposure slit.

A top view of the semiconductor device 100 and the lithography mask 114 of FIG. 2 is shown in FIG. 3. The area in the objective plane to be imaged onto the wafer 100 in the image plane comprises a small rectangular box (e.g., static exposure slit 138) which is illuminated with the imaging light 112. The mask 114 is scanned through the static exposure slit 138 at a predetermined speed. The predetermined speed is M times the speed at which the wafer 100 is scanned, with M being the demagnification factor of typically about 4 or 5 in size, although different, i.e., higher, demagnification factors may also be used, and are expected to be used in the future, for example. The aerial image captured in the illuminated mask area is reduced by the demagnification factor M, for example 4×, as it goes through the projection optics of the system and is transferred onto a wafer field 106 that is scanned through the demagnified illumination area. The exposure slit after demagnification in the illumination area is shown at 140. After the mask image has been transferred onto a wafer field 106a ($1/M^2$ the area of the patterned mask area 136), the wafer 100 is stepped to the starting position for the next field 106, the mask 114 is moved back to the start position for the next scan, and the mask pattern is transferred to the new field 106 in the next scan. Each field 106 of the wafer 100 may comprise a single die or a plurality of die, for example.

Figure 4:
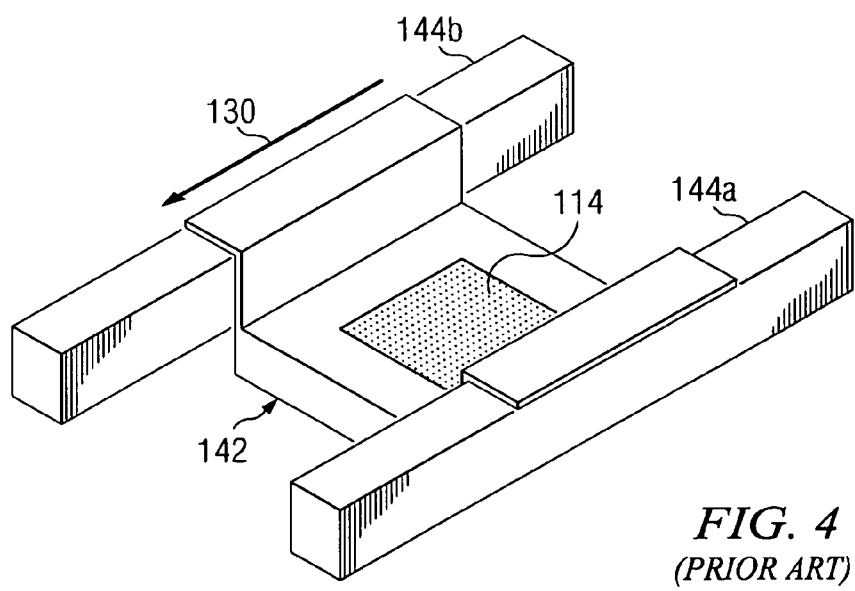
FIG. 4 shows a perspective view of a prior art reticle stage adapted to support one lithography mask.

A prior art reticle stage 142 is shown in FIG. 4. The reticle stage 142 is attachable to a first support rail 144a and a second support rail 144b, as shown. The prior art reticle stage 142 is adapted to support a single lithography mask 114, as shown. If a double exposure is required, all of the fields 106 are scanned with two different masks 114 that are loaded into the same reticle stage 142, one after the other.

Current lithography tools and systems are adapted to hold only one mask 114 in the reticle stage 142 that receives the mask 114. For double exposure processes, in prior art lithography systems, the mask 114 must be unloaded and a new mask 114 must be loaded onto the reticle stage 142 in order to complete the wafer 100 exposure. Because the prior art reticle stage 142 only holds one mask 114, significant overhead time is required and throughput is reduced, since masks 114 have to be switched in and out of the reticle stage 142 after each wafer is patterned.

Figure 5:
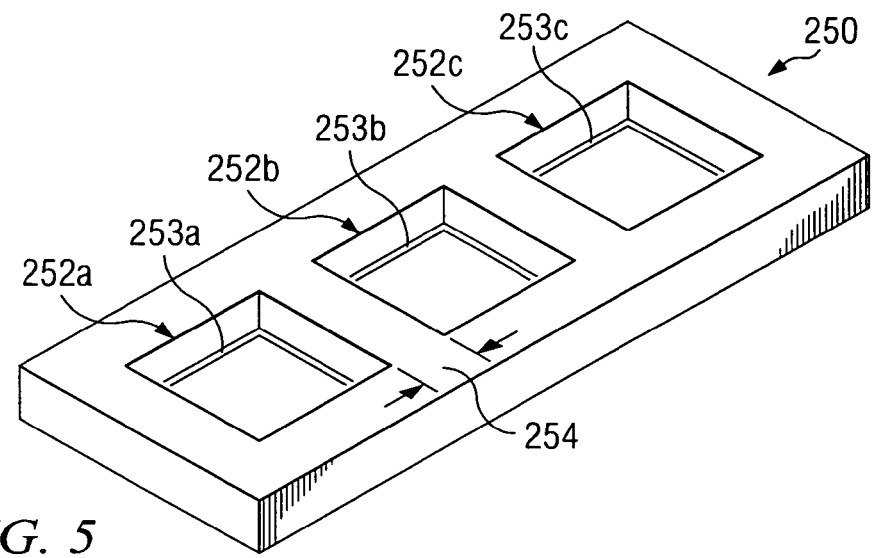
FIG. 5 shows a perspective view of a reticle stage adapted to support three lithography masks in accordance with a preferred embodiment of the present invention.

Embodiments of the present invention comprise novel reticle stages or supports that are adapted to carry two or more lithography masks or reticles at a time. FIG. 5 shows a perspective view of a reticle stage 250 in accordance with a preferred embodiment of the present invention. The reticle stage 250 includes two or more regions 252a, 252b, and 252c adapted to support a lithography mask. Regions 252a, 252b, and 252c are also referred to as support regions, for example. The regions 252a, 252b, and 252c may comprise an aperture that is substantially the size of the lithography masks to be supported, for example. The reticle stage 250 preferably comprises a material such as aluminum or steel, although ceramic, composite, or plastic materials may also be used for the material of the reticle stage 250, as examples. The reticle stage 250 may be milled or molded to achieve the desired shape, for example.

Each region 252a, 252b, and 252c for supporting and holding a lithography mask includes a retainment means 253a, 253b, and 253c. Each of the retainment means 253a, 253b, and 253c may include a lip or a plurality of contact points adapted to retain a lithography mask within the corresponding aperture within the reticle stage 250, for example. For example, the retainment means 253a, 253b, and 253c shown in FIG. 5 comprise one or more lips proximate the edge of the apertures or regions 252a, 252b, and 252c. The retainment means 253a, 253b, and 253c may comprise lips disposed on at least two opposing sides of the apertures, for example.

In other embodiments, the retainment means 253a, 253b, and 253c may include a transparent plate or material (not shown) disposed over the apertures or regions 252a, 252b, and 252c. The transparent material may comprise glass, plastic, quartz, or other transparent material, for example. The transparent material may provide the retainment means 253a, 253b, or 253c for the plurality of lithography masks, for example.

The retainment means 253a, 253b, and 253c may also comprise one or more lips, contact points, translucent plates, or combinations thereof, as examples. The retainment means 253a, 253b, and 253c may also include a lateral retainment mechanism, such as a spring-operated mechanism or other mechanism (not shown) that is adapted to prevent lithography masks or reticles from moving laterally within the reticle support 250 during the movement of the reticle support 250, for example. Before, during, and after the patterning and scanning processes, the reticle support 250 is moved, e.g., the reticle support 250 is accelerated and decelerated. The lateral retainment mechanism is adapted to keep the masks in place, preventing the masks from sliding on the lips, contact points, or transparent material of the retainment means 253a, 253b, and 253c, for example.

The support regions 252a, 252b, and 252c for the lithography masks are preferably separated by a distance 254, as shown, in some embodiments, wherein the distance 254 comprises about 1 inch or less, as an example.

In another embodiment, the regions 252a, 252b, and 252c directly abut and are adjacent to one another, for example, e.g., distance 254 may comprise zero. In this embodiment, each mask is placed directly abutting an adjacent mask (not shown) within the support regions 252a, 252b, and 252c. The support regions 252a, 252b, and 252c may comprise a single support region large enough to support all of the lithography masks supported by the stage 250, for example, not shown.

Figure 6:
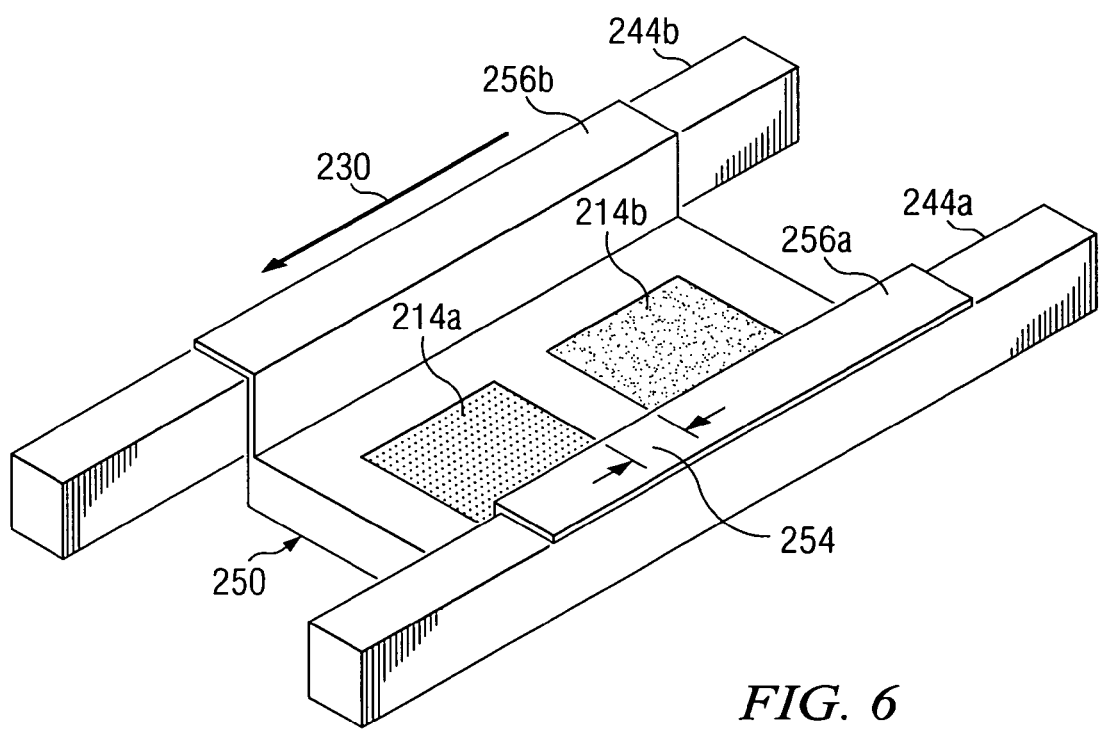
FIG. 6 shows a perspective view of a reticle stage adapted to support two lithography masks in accordance with another preferred embodiment of the present invention.
Figure 9:
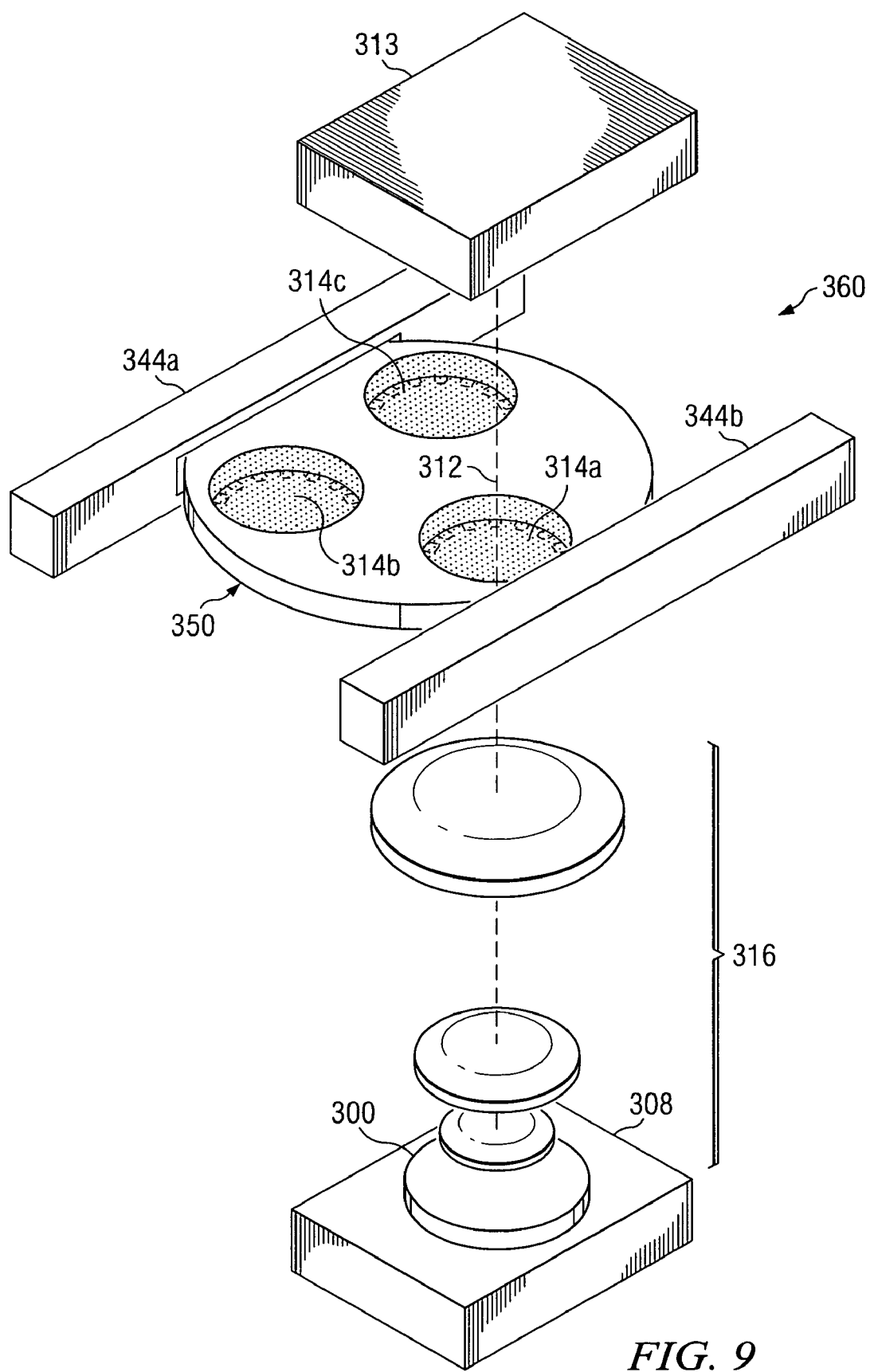
FIG. 9 illustrates an embodiment of the present invention wherein the reticle stage is rotatable.
Figure 10:
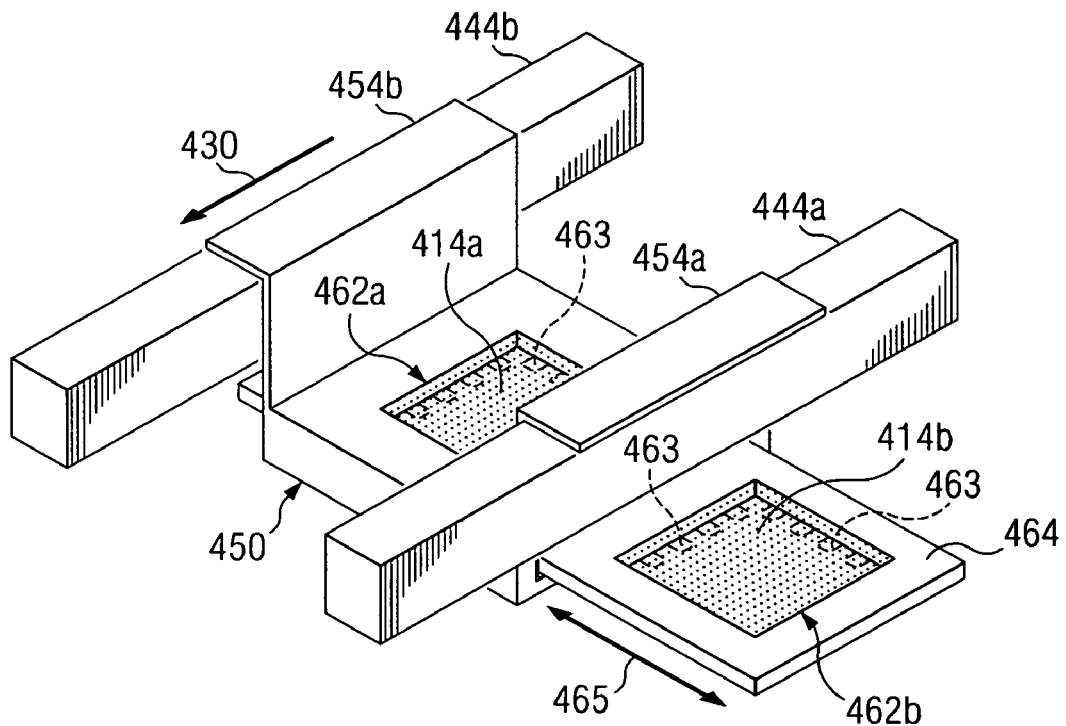
FIG. 10 shows a perspective view of an embodiment of the present invention wherein the reticle stage includes a slidable insert adapted to support a plurality of lithography masks.

In some embodiments, the support regions 252a, 252b, and 252c of the reticle stage 250 are fixed, e.g., the support regions 252a, 252b, and 252c are not moveable with respect to the other regions of the reticle stage 250, as shown in FIGS. 5 and 6. However, in other embodiments, the support regions 252a, 252b, and 252c are moveable with respect to the other regions of the reticle stage 250. For example, the support regions 252a, 252b, and 252c may be rotatable or slidable, as shown in FIGS. 9 and 10, respectively, to be described further herein.

FIG. 6 shows a perspective view of a reticle stage 250 in accordance with another preferred embodiment of the present invention. The embodiments shown in FIG. 6 includes a first region adapted to support a first lithography mask 214a, and a second region adapted to support a second lithography mask 214b. The reticle stage 250 may be attachable to support rails 244a and 244b, e.g., by attachment members 256a and 256b. The attachment members 256a and 256b may be adapted to attach to or hang over the support rails 244a and 244b, as shown. The rails 244a and 244b are preferably coupled to a handler (not shown in FIG. 6; see FIG. 11) that is adapted to move the reticle stage 250, e.g., during the scanning process, during alignment of each mask 214a and 214b, and during repositioning of the reticle stage 250 to position the first mask 214a or the second mask 214b, for example. The reticle stage 250 is moved during exposure of a wafer in a direction 230, as shown.

Figure 7:
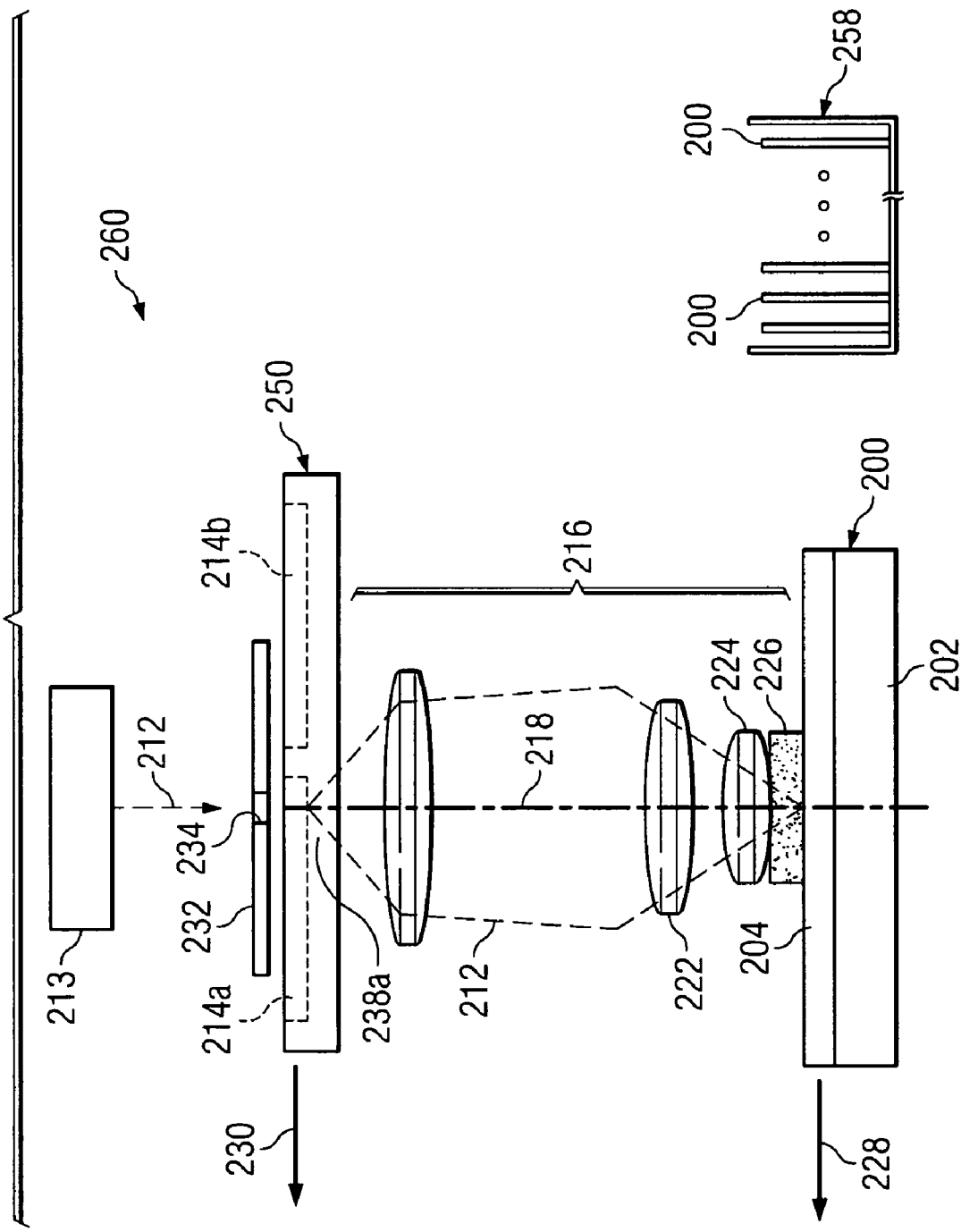
FIGS. 7 and 8 show a lithography system implementing a novel reticle stage in accordance with a preferred embodiment of the present invention.
Figure 8:
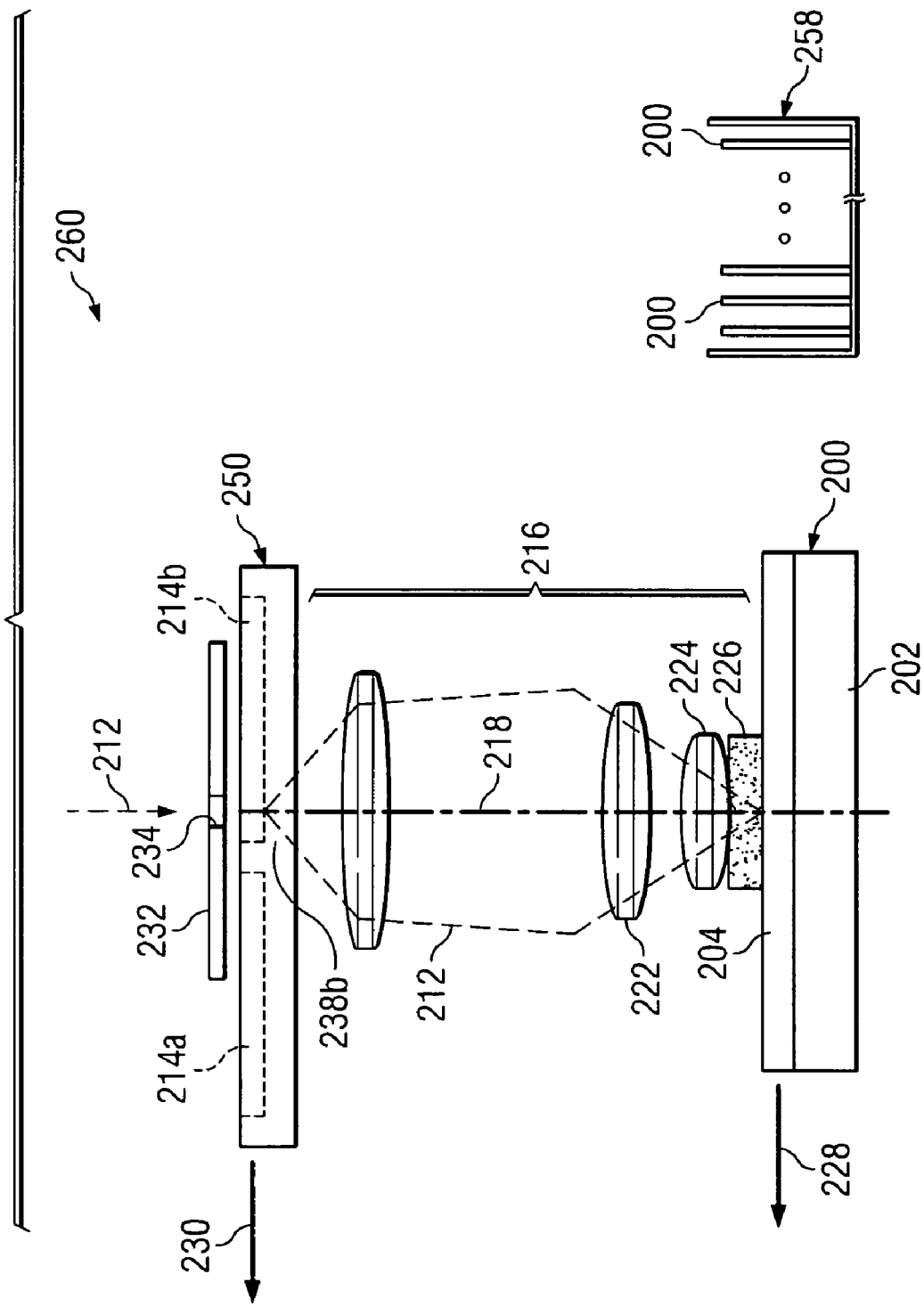

FIGS. 7 and 8 show a lithography system 260 implementing a novel reticle stage 250 in accordance with a preferred embodiment of the present invention. Like numerals are used in FIGS. 7 and 8 as were used in the previous figures, and to avoid repetition, all of the elements are not described in detail again herein. Rather, similar materials x02, x04, x06, x08, etc . . . are preferably used for the various elements shown as were described for the previous figures, where x=1 in FIGS. 1 through 4, and x=2 in FIGS. 5 through 8.

In FIG. 7, the first lithography mask 214a is positioned along the optical axis 218 of the lens system or the optic column 216 and the first lithography mask 214a is aligned. The first lithography mask 214a is used to pattern the layer of photosensitive material 204 on the wafer 100, e.g., as shown at the illumination region 238a. The mask 214a is moved during the scanning process in a direction 230 and the wafer 200 is moved in a direction 228 while the wafer 200 is illuminated with light 212 radiating from a light source 213.

A lot of wafers 200 may be contained in a box or container 258, as shown, and each wafer is moved from the box 258 one at a time to a wafer support (not shown in FIG. 7) to be patterned, e.g., using a wafer handler, not shown. Each wafer 200 is aligned, and the first lithography mask 214a is used to pattern a portion of the layer of photosensitive material 204 of the wafer 200.

FIG. 8 shows the lithography system 260 shown in FIG. 7, wherein after the first lithography mask 214 has been used to pattern one or more wafers 200, the second lithography mask 214b is positioned along the optical axis 218 of the optics column 216, and the second lithography mask 214b is aligned. The second lithography mask 214b is then used to pattern a portion of the layer of photosensitive material 204 of the wafer 200, e.g., as shown at the illumination region 238b.

Advantageously, the first lithography mask 214a may comprise a different pattern than the second lithography mask 214b. The first lithography mask 214a may be used to pattern a first portion of the wafer 200, and the second lithography mask 214b may be used to pattern a second portion of the wafer 200. The first lithography mask 214a may comprise features that run horizontally, e.g., in the same direction 230 of the scanning of the lithography system, and the second lithography mask 214b may comprise features that also run horizontally, or the features may run vertically in a direction perpendicular to the scanning direction 230, as examples.

In another embodiment, the first lithography mask 214a may comprise a pattern for contacts or substantially round features, and the second lithography mask 214b may comprise a pattern for transistor gates, conductive lines, or other substantially rectangular features, as an example.

FIG. 9 illustrates an embodiment of the present invention wherein the reticle stage 350 is rotatable. The first reticle or mask 314a, second reticle or mask 314b, and a third reticle or mask 314c may be supported by a member that is rotatable, as shown. Again, like numerals are used for the various elements that were used to describe the previous figures, and to avoid repetition, each reference number shown in FIG. 9 is not described again in detail herein. The rotatable reticle stage 350 may be coupleable to the support rails 344a and 344b that are coupled to a motor or other device adapted to move the rotatable reticle stage 350 in the scanning direction as the wafer is exposed.

In FIG. 5, the support regions 252a, 252b, and 252c of the reticle stage 250 are substantially square, to accommodate substantially square lithography masks, for example. Alternatively, the support regions 252a, 252b, and 252c may comprise other shapes, such as rectangular, round, elliptical, triangular, or trapezoidal, or other shapes, to accommodate lithography masks comprising these shapes. For example, in FIG. 9, the support regions of the rotatable reticle stage 350 are circular or round, to accommodate circular reticles or masks 314a, 314b, and 314c; alternatively, the rotatable reticle stage 350 may be adapted to support reticle stages comprising other shapes. In many semiconductor designs, for example, the pattern to be imaged on a portion of a semiconductor device comprises a rectangular shape, in order to produce rectangular exposure fields on the wafers.

A wafer support 308 is shown in FIG. 9 that is adapted to support the wafer 300 being patterned. The embodiments of the present invention shown in FIGS. 7 and 8 may also include a wafer support 308, for example. The reticle stage 350 is rotated to position the desired lithography masks 314a, 314b, or 314c on the optical axis to pattern one or more portions of the wafer 300, and then the reticle stage 350 is rotated again to position another of the lithography masks 314a, 314b, or 314c in position to be used to pattern another portion of the wafer 300, for example. Only three lithography masks 314a, 314b, and 314c are shown in FIG. 9; alternatively, there may be more lithography masks disposed on the rotatable member, for example, not shown.

FIG. 10 shows a perspective view of an embodiment of the present invention wherein the reticle stage 450 includes a slidable insert or member 464 including a plurality of lithography masks 414a and 414b. The member 464 may be adapted to slide into a portion of the reticle stage 450, and the member 464 may be slid or moved in a direction 465 to position the desired lithography mask 414a or 414b in position to be used to pattern a semiconductor wafer. Again, like numerals are used for the various elements that were described in the previous drawings, and to avoid repetition, each reference number shown in FIG. 10 is not described again in detail herein.

The member 464 may include support regions 462a and 462b adapted to support a first lithography mask 414a and a second lithography mask 414b, respectively. The support regions 462a and 462b may include retainment means 463 adapted to retain the lithography masks 414a and 414b within the slidable member. The retainment means 463 comprise a plurality of contact points in FIG. 10, for example. Alternatively, the retainment means 463 may comprise one or more lips, a transparent plate or material disposed across a bottom surface of the apertures of the support regions 462a and 462b, or other retaining devices and mechanisms, for example. The support regions 462a and 462b of the member 464 comprise squares in FIG. 10; however, alternatively, the support regions 462*a* and 462*b* may comprise rectangles, round, or other shapes, as examples, according to the lithography mask 414*a* and 414*b* shape.

Figure 11:
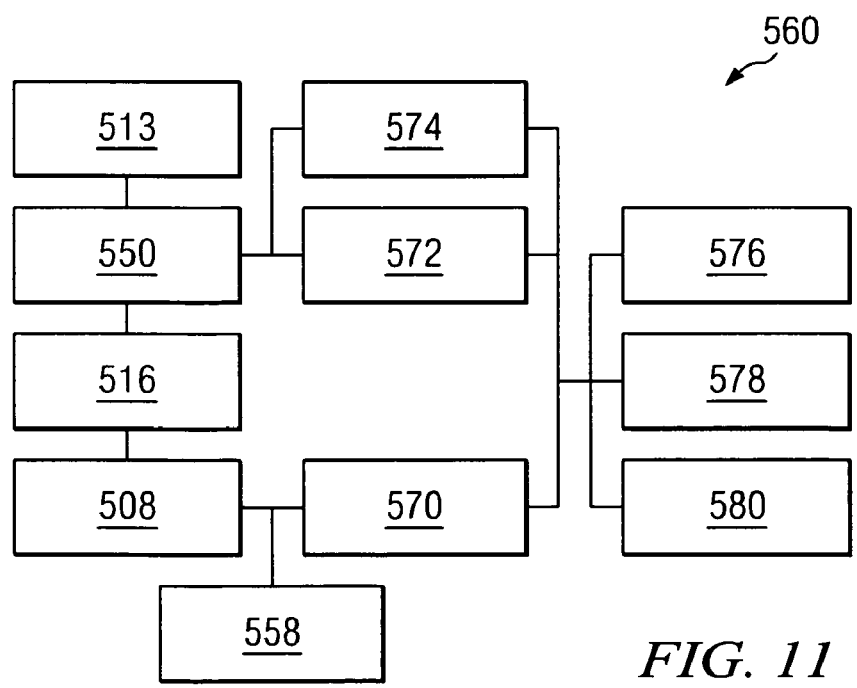
FIG. 11 is a block diagram showing various components and subsystems of a lithography system in accordance with a preferred embodiment of the present invention.

FIG. 11 is a block diagram showing various components of a lithography system 560 in accordance with a preferred embodiment of the present invention. Again, like numerals are used for the various elements that were described in the previous drawings, and to avoid repetition, each reference number shown in FIG. 11 is not described again in detail herein. A wafer handler 570 may be coupled to a wafer stage 508 and may be proximate a container 558 for storing a lot of wafers to be patterned. The wafer handler 570 is preferably adapted to move the wafers from the container 558 to the wafer stage 508 to be patterned. The wafer handler 570 may also be adapted to move the wafer stage 508 and the wafer during the scanning process, although a separate handler may also be used to move the wafer stage 508 while scanning, not shown.

A mask handler 572 is preferably located proximate or coupled to the reticle stage 550, as shown. The mask handler 572 is adapted to move the reticle stage 550 to position the desired lithography mask (e.g., masks 214*a*, 214*b*, 314*a*, 314*b*, 314*c*, 414*a*, 414*b*) into position for patterning. The system 560 may include an aligner 574 adapted to align the lithography masks 214*a*, 214*b*, 314*a*, 314*b*, 314*c*, 414*a*, 414*b*. The system 560 may also include an aligner adapted to align the wafers 200 to be patterned, not shown. A user interface 576, processor 578, and controller 580 may be included in the system for coordinating, analyzing, and controlling the various functions of the system 560, for example.

Referring again to FIG. 7, each die of a semiconductor wafer 200 may be individually patterned using the first lithography mask 214*a* of the novel reticle stage 250 in a step-and-scan exposure procedure, for example. Then, a second lithography mask 214*b* of the reticle stage 250 is placed into position, as shown in FIG. 8, and each die of the semiconductor wafer 200 may be individually patterned using the second lithography mask 214*b*. Alternatively, a plurality of die may be patterned with each step-and-scan exposure procedure, for example.

A wafer 200 may be placed upon a wafer stage 208, and then patterned with a first lithography mask 214*a*. Without removing the wafer 200 from the wafer stage 208, a second lithography mask 214*b* may be placed in position, and the second lithography mask 214*b* may be used to pattern another portion of the wafer 200. The wafer 200 is then placed in the container for the lot, and another wafer 200 is placed on the wafer stage 208 for patterning using the novel reticle stage 250, 350, 450 adapted to hold two or more lithography masks. Thus, in a first pass using the first lithography mask 214*a*, all fields on the wafer can be exposed, and in a second pass, all fields on the wafer can be exposed using the second lithography mask 214*b*. After that, the next wafer 200 is loaded and exposure with the first mask 214*a* begins again. Each wafer 200 is aligned within the lithography system 260 only once, and each lithography mask 214*a*, 214*b* is aligned once for each wafer 200 in this embodiment.

Alternatively, the entire lot of wafers in a container 258 may be patterned using a first lithography mask 214*a*, and each wafer 200 is removed by the container 258 one at a time and patterned using the second lithography mask 214*b* of the multiple-reticle stage 250, 350, 450 of embodiments of the present invention. In this embodiment, the first lithography mask 214*a* is aligned only once, and the second lithography mask 214*b* is aligned only once. Each wafer is aligned two times, once for the exposure process for each mask 214*a*, 214*b*.

Thus, double exposures can be performed with a high throughput using the novel reticle stages 250, 350, 450 adapted to support two or more reticles at a time described herein.

For each of the lithography masks the most suitable illumination mode is preferably used. The illumination mode for each lithography mask may be predetermined and selected or programmed in as needed, for example.

Embodiments of the present invention increase the throughput of lithography tools that need to run double exposures. A significant cost savings may be realized by the use of embodiments of the present invention, by the use of the novel reticle stages 250, 350, 450 described herein that enable exposing two masks in succession without having to load and unload masks. A lithography tool with such a reticle stage for double exposures will be able to nearly match the throughput that current lithography tools have for single mask exposures, for example.

While embodiments of the present invention described herein disclose several structures of reticle stages that are adapted to accommodate two or more masks at a time, there are many different ways to build a reticle stage that can accommodate two masks at a time, for example. Advantageously, the novel reticle stages disclosed herein include two or more dedicated areas adapted to hold a lithography mask. The lithography masks may be separately aligned and may be moved quickly into the illumination for scanning.

Embodiments of the present invention include the novel reticle stages 250, 350, 450, and 550 described herein that are adapted to support two or more lithography reticles or masks. Embodiments of the present invention also include lithography systems that implement the reticle stages 250, 350, 450, and 550. Embodiments of the present invention also include methods of patterning material layers of semiconductor devices using the novel reticle stages 250, 350, 450, and 550, and semiconductor device patterned using the reticle stages 250, 350, 450, and 550, as examples.

For example, in accordance with a preferred embodiment, a method of patterning a material layer of a semiconductor device includes providing a workpiece, the workpiece comprising a material layer to be patterned and a layer of photosensitive material disposed over the material layer, the layer of photosensitive material comprising a first region and a second region, and providing a lithography system comprising a reticle support adapted to support at least a first lithography mask and at least one second lithography mask. The method includes patterning the first region of the layer of photosensitive material with the first lithography mask, patterning the at least one second region of the layer of photosensitive material with the at least one second lithography mask, developing the layer of photosensitive material, and using the layer of photosensitive material to pattern the material layer of the workpiece. Patterning the first region of the layer of photosensitive material may comprise forming at least one first feature comprising a first width in a first direction and a first length in a second direction, the first length being greater than the first width. Patterning the at least one second region of the layer of photosensitive material may comprise forming at least one second feature comprising a second length in the first direction and a second width in the second direction, the second length being greater than the second width. Patterning the first region of the layer of photosensitive material and patterning the at least one second region of the layer of photosensitive material may comprise forming the at least one first feature and the at least one second feature wherein the first length of the at least one first feature is substantially the same as the second length of the at least one second feature, and wherein the first width of the at least one first feature is substantially the same as the second width of the at least one second feature. Patterning the first region of the layer of photosensitive material with the first lithography mask, patterning the at least one second region of the layer of photosensitive material with the at least one second lithography mask, or both, may comprise patterning a minimum feature size of the semiconductor device, for example.

Embodiments of the present invention may be used in lithography masks comprising opaque and transparent regions, in alternating phase-shift masks, combinations thereof, and other types of lithography masks, for example. The masks 214a, 214b, 314a, 314b, 314c, 414a, and 414b may comprise a substantially transparent material comprising quartz glass having a thickness of about ¼", with a non-transparent material such as chromium, which is opaque, having a thickness of about 30 nm bonded to the quartz glass. Alternatively, the non-transparent material may comprise about 70 nm of a translucent material such as molybdenum silicon (MoSi), or a bilayer of tantalum and silicon dioxide (Ta/SiO$_2$). Alternatively, other materials and dimensions may also be used for the transparent material and the non-transparent material of the masks 214a, 214b, 314a, 314b, 314c, 414a, and 414b, for example.

Embodiments of the present invention are described herein with reference to optical lithography systems and masks 214a, 214b, 314a, 314b, 314c, 414a, and 414b, and may be implemented in lithography systems that utilize ultraviolet (UV) or extreme UV (EUV) light, as examples. The novel reticle stages, lithography systems, and patterning methods described herein may also be used in non-optical lithography systems, x-ray lithography systems, interference lithography systems, short wavelength lithography systems, Scattering with Angular Limitation in Projection Electron-beam Lithography (SCALPEL) systems, immersion lithography systems, or other lithography systems that utilize lithography masks, as examples.

Features of semiconductor devices patterned using the novel lithography reticle stages, lithography systems and methods described herein may comprise transistor gates, conductive lines, vias, capacitor plates, and other features, as examples. Embodiments of the present invention may be used to pattern features of memory devices, logic circuitry, and/or power circuitry, as examples, although other types of ICs may also be fabricated using the novel lithography reticle stages, lithography systems, and patterning methods described herein.

Advantages of embodiments of the invention include providing novel reticle stages that increase the throughput of semiconductor devices by supporting more than one lithography mask simultaneously.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A lithography system, comprising:
   a base structure;
   a reticle stage supported by said base structure such that said reticle stage can move in a first direction;
   a slide member movable in a second direction orthogonal to said first direction;
   a first region of said slide member adapted to support a first reticle; and
   at least one second region of said slide member adapted to support a second reticle.

2. The lithography reticle stage according to claim 1, wherein the lithography reticle stage is adapted to be used in a lithography system for patterning a material layer of a semiconductor device.

3. The lithography reticle stage according to claim 1, wherein the first region comprises a first aperture, and wherein the at least one second region comprises at least one second aperture proximate the first aperture.

4. The lithography reticle stage according to claim 3, further comprising at least one first lip, first contact point, first transparent material, and/or first lateral retainment mechanism disposed proximate the first aperture, and at least one second lip, second contact point, second transparent material, and/or second lateral retainment mechanism disposed proximate the at least one second aperture, wherein the at least one first lip, first contact point, first transparent material, and/or first lateral retainment mechanism is adapted to retain the first reticle within the first aperture of the support member, and wherein the at least one second lip, second contact point, second transparent material, and/or second lateral retainment mechanism is adapted to retain the second reticle within the at least one second aperture of the support member.

5. The lithography reticle stage according to claim 1, wherein the second reticle is different than the first reticle.

6. The lithography system of claim 1 further comprising:
   a wafer stage;
   an energy source;
   a lens system disposed between the wafer stage and the energy source; and
   said reticle stage is disposed between the energy source and the lens system and wherein the second reticle is different than the first reticle.

7. The lithography system of claim 6 further comprising:
   a means for aligning the first reticle and the second reticle.

8. The lithography system according to claim 1, wherein the lithography system comprises an optical lithography system, a non-optical lithography system, an x-ray lithography system, an interference lithography system, a short wavelength lithography system, a Scattering with Angular Limitation in Projection Electron-beam Lithography (SCALPEL) system, an immersion lithography system, or an ultraviolet (UV) or extreme UV (EUV) light lithography system.

9. A method of patterning a material layer of a semiconductor device, comprising:
   providing a workpiece, the workpiece comprising a material layer to be patterned and a layer of photosensitive material disposed over the material layer;
   providing a base support;

providing a lithography system comprising a reticle stage supported by said base support, such that said reticle stage can move in a first direction, said reticle stage adapted to support a slide member for moving in a second direction orthogonal to said first direction and said slide member supporting at least a first lithography mask and at least one second lithography mask;

patterning the first region of the layer of photosensitive material with the first lithography mask;

patterning the at least one second region of the layer of photosensitive material with the at least one second lithography mask;

developing the layer of photosensitive material; and using the layer of photosensitive material to pattern the material layer of the workpiece.

10. The method according to claim 9, wherein patterning the first region of the layer of photosensitive material comprises forming at least one first feature comprising a first width in a first direction and a first length in a second direction, the first length being greater than the first width, and wherein patterning the at least one second region of the layer of photosensitive material comprises forming at least one second feature comprising a second length in the first direction and a second width in the second direction, the second length being greater than the second width.

11. The method according to claim 10, wherein patterning the first region of the layer of photosensitive material and patterning the at least one second region of the layer of photosensitive material comprise forming the at least one first feature and the at least one second feature wherein the first length of the at least one first feature is substantially the same as the second length of the at least one second feature, and wherein the first width of the at least one first feature is substantially the same as the second width of the at least one second feature.

12. The method according to claim 9, wherein patterning the first region of the layer of photosensitive material with the first lithography mask, patterning the at least one second region of the layer of photosensitive material with the at least one second lithography mask, or both, comprise patterning a minimum feature size of the semiconductor device.

* * * * *